(12) United States Patent
Kuan et al.

(10) Patent No.: US 8,513,542 B2
(45) Date of Patent: Aug. 20, 2013

(54) INTEGRATED CIRCUIT LEADED STACKED PACKAGE SYSTEM

(75) Inventors: Heap Hoe Kuan, Singapore (SG); Tsz Yin Ho, Tuen Mun (HK); Dioscoro A. Merilo, Singapore (SG); Seng Guan Chow, Singapore (SG); Antonio B. Dimaano, Singapore (SG)

(73) Assignee: Stats Chippac Ltd., Singapore (SG)

( * ) Notice: Subject to any disclaimer, the term of this patent is extended or adjusted under 35 U.S.C. 154(b) by 1315 days.

(21) Appl. No.: 11/276,645

(22) Filed: Mar. 8, 2006

(65) Prior Publication Data

US 2007/0209834 A1    Sep. 13, 2007

(51) Int. Cl.
*H01L 23/495* (2006.01)
*H01L 23/02* (2006.01)

(52) U.S. Cl.
USPC ........... 174/529; 174/538; 174/541; 257/686; 257/787

(58) Field of Classification Search
USPC .................. 257/686, 787, 777; 174/529, 538, 174/541
See application file for complete search history.

(56) References Cited

U.S. PATENT DOCUMENTS

| | | | |
|---|---|---|---|
| 5,147,815 | A | 9/1992 | Castro |
| 5,685,477 | A | 11/1997 | Mallik et al. |
| 6,168,975 | B1 | 1/2001 | Zhang et al. |
| 6,190,944 | B1 | 2/2001 | Choi |
| 6,229,200 | B1 | 5/2001 | Mclellan et al. |
| 6,420,779 | B1 | 7/2002 | Sharma et al. |
| 6,420,799 | B1 | 7/2002 | Sakamoto et al. |
| 6,607,937 | B1 | 8/2003 | Corisis |
| 6,815,806 | B1 | 11/2004 | Awad et al. |
| 6,838,751 | B2 | 1/2005 | Cheng et al. |
| 6,861,288 | B2 | 3/2005 | Shim et al. |
| 6,927,096 | B2 | 8/2005 | Shimanuki |
| 7,247,934 | B2 * | 7/2007 | Pu .............................. 257/686 |
| 2002/0109216 | A1 * | 8/2002 | Matsuzaki et al. ............ 257/686 |
| 2003/0127721 | A1 * | 7/2003 | Fukuda et al. ................ 257/686 |
| 2004/0114426 | A1 | 6/2004 | Fee et al. |

* cited by examiner

*Primary Examiner* — Hung Ngo
(74) *Attorney, Agent, or Firm* — Ishimaru & Associates LLP

(57) ABSTRACT

An integrated circuit leaded stacked package system includes forming a no-lead integrated circuit package having a mold cap, and attaching a mold cap of an extended-lead integrated circuit package facing the mold cap of the no-lead integrated circuit package.

13 Claims, 8 Drawing Sheets

INTEGRATED CIRCUIT LEADED STACKED PACKAGE SYSTEM

CROSS-REFERENCE TO RELATED APPLICATIONS

The present application contains subject matter related to concurrently filed U.S. patent application Ser. No. 11/276,646, now U.S. Pat. No. 7,986,043. The related application is assigned to STATS ChipPAC Ltd.

The present application contains subject matter also related to concurrently filed U.S. patent application Ser. No. 11/276,657, now U.S. Pat. No. 7,981,702. The related application is assigned to STATS ChipPAC Ltd.

TECHNICAL FIELD

The present invention relates generally to integrated circuit package systems, and more particularly to an integrated circuit package system for a package on package.

BACKGROUND ART

As more and more products include integrated circuits ("IC's"), new generations of IC products increase in functionality increases while the size and number of components decreases. IC's have become such an integral part of so many daily activities that the needs for IC's continue to demand higher performance, lower cost, increased miniaturization of components, and greater packaging density of IC's. These demands make the IC's susceptible to damage during manufacturing and in use. Commonly, a package is used which both protects the circuit and provides electrical interconnections to external circuitry. The package often encases the IC and its connectivity to the electrical interconnections.

IC devices are constructed from a silicon or gallium arsenide wafer through a process that comprises a number of deposition, masking, diffusion, etching, and implanting steps. Usually, many individual devices are constructed on the same wafer. When the devices are separated into individual rectangular units, each takes the form of an IC die. In order to interface a die with other circuitry, it is common to mount it on a leadframe or on a multi-chip module no-lead leadframe that is surrounded by a number of lead fingers. Each die has bonding pads that are then individually connected in a wire-bonding operation to the leadframe's lead finger pads using extremely fine gold or aluminum wires. The assemblies are then packaged by individually encapsulating them in molded plastic or ceramic bodies.

IC packaging technology has shown an increase in semiconductor chip density (the number of chips mounted on a single circuit board or no-lead leadframe) that parallels the reduction in the number of components that are needed for a circuit. This results in packaging designs that are more compact, in form factors (the physical size and shape of a device) that are more compact, and in a significant increase in overall IC density. However, IC density continues to be limited by the space (or "real estate") available for mounting individual die on a no-lead leadframe.

To condense further the packaging of individual devices, packages have been developed in which more than one device can be packaged at one time at each package site. Each package site is a structure that provides mechanical support for the individual IC devices. It also provides one or more layers of interconnect lines that enable the devices to be connected electrically to surrounding circuitry. Of importance to complicated packaging designs are considerations of input/output count, heat dissipation, matching of thermal expansion between a motherboard and its attached components, cost of manufacturing, ease of integration into an automated manufacturing facility, package reliability, and easy adaptability of the package to additional packaging interfaces such as a printed circuit board ("PCB").

In some cases, multi-chip devices can be fabricated faster and more cheaply than a corresponding single IC chip that incorporates all the same functions. Current multi-chip modules typically consist of a substrate or leadframe onto which a set of separate IC chip components is directly attached. Such multi-chip modules have been found to increase circuit density and miniaturization, improve signal propagation speed, reduce overall device size and weight, improve performance, and lower costs—all primary goals of the computer industry.

However, such multi-chip modules can be bulky. IC package density is determined by the area required to mount a die or module on a circuit board. One method for reducing the board size of multi-chip modules and thereby increase their effective density is to stack the die or chips vertically within the module or package.

Such designs are improvements over prior multi-chip package and system-in-a-package ("SiP") designs that combined several semiconductor die and associated passive components ("passives") side by side in a single, horizontal layer. Combining them into a single horizontal layer used board space inefficiently by consuming large no-lead leadframe areas, and afforded less advantage in circuit miniaturization.

However, multi-chip modules, whether vertically or horizontally arranged, can also present problems because they usually must be assembled before the component chips and chip connections can be tested. That is, because the electrical bond pads on a die are so small, it is difficult to test die before assembly onto a no-lead leadframe. Thus, when die are mounted and connected individually, the die and connections can be tested individually, and only known-good-die ("KGD") that are free of defects are then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process problems including yield.

Despite the advantages of recent developments in semiconductor fabrication and packaging techniques, there is a continuing need for improved packaging methods, systems, and designs for increasing semiconductor die density in PCB assemblies.

Thus, a need still remains for an integrated circuit leaded stacked package system to provide improved reliability and manufacturing yield. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit leaded stacked package system, forming a no-lead integrated circuit package having a mold cap, and attaching a mold cap of an extended-lead integrated circuit package facing the mold cap of the no-lead integrated circuit package.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
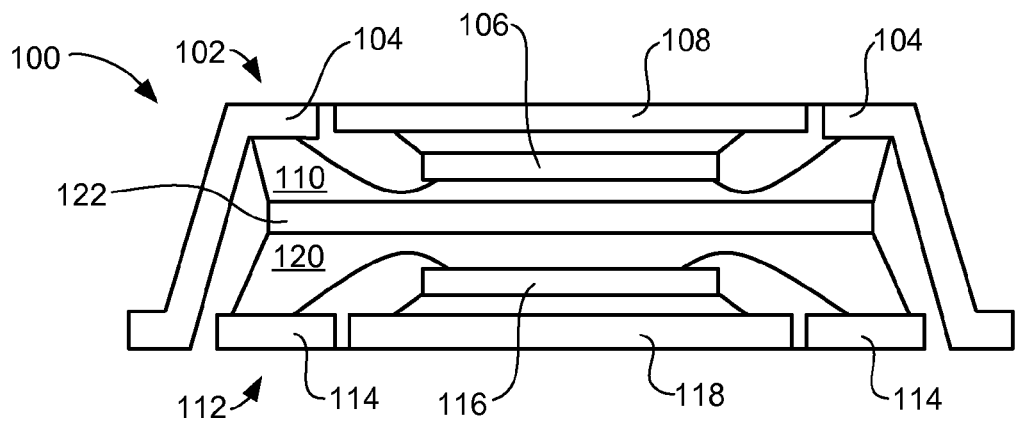
FIG. 1 is a cross-sectional view of an integrated circuit leaded stacked package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. In addition, the same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. The term "on" refers to direct contact among elements. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit leaded stacked package system 100 in an embodiment of the present invention. The integrated circuit leaded stacked package system 100 includes an extended-lead integrated circuit package 102. The extended-lead integrated circuit package 102 includes extended leads 104. A first integrated circuit die 106 is attached and electrically connected to the extended leads 104 and an extended-lead die paddle 108. The first integrated circuit die 106 is substantially fixed on the extended-lead die paddle 108. An extended-lead encapsulant 110, such as a mold cap or cover, may be applied with a substantially one-sided molding process to cover the first integrated circuit die 106 and partially cover the extended leads 104.

For illustrative purposes, the first integrated circuit die 106 is shown as a wire bondable integrated circuits die, although it is understood that the first integrated circuit die 106 may be different, such as a flip chip. Further, for illustrative purposes the extended-lead integrated circuit package 102 is shown with one integrated circuit die, although it is understood that any number of integrated circuit die may be included.

The integrated circuit leaded stacked package system 100 also includes a no-lead integrated circuit package 112, such as a quad flat no lead, a small outline no lead or a land grid array, having no-lead pads 114. The no-lead, integrated package 112 is defined as a package having the exposed (bottom) portions of the leads coplanar with the bottom of the package with the leads not extending, or extending only slightly, beyond the area of the package. A second integrated circuit die 116 is attached and electrically connected to the no-lead pads 114 and a no-lead die paddle 118. The second integrated circuit die 116 is substantially fixed on the no-lead die paddle 118. A no-lead encapsulant 120 covers the second integrated circuit die 116 and partially covers the no-lead pads 114.

For illustrative purposes the second integrated circuit die 116 is shown as a wire bondable integrated circuit die, although it is understood that the second integrated circuit die 116 may be different, such as a flip chip. Further, for illustrative purposes the no-lead integrated circuit package 112 is shown with one integrated circuit die, although it is understood that any number of integrated circuit die may be included.

The extended-lead integrated circuit package 102 is mounted over the no-lead integrated circuit package 112 having the extended-lead encapsulant 110 facing the no-lead encapsulant 120. A package-stacking layer 122 holds the extended-lead integrated circuit package 102 and the no-lead integrated circuit package 112 in a substantially fixed position. It has been discovered that a side opposite the first integrated circuit die 106 of the extended-lead integrated circuit package 102 may serve as an interposer for additional devices or packages.

The extended leads 104 extend to a surface of the no-lead integrated circuit package 112 opposite the second integrated circuit die 116. The extended leads 104 provide electrical interconnectivity for the first integrated circuit die 106 in substantially the same plane as the no-lead pads 114 for the second integrated circuit die 116. The first integrated circuit die 106 and the second integrated circuit die 116 may be connected to a next level system such as a printed circuit board.

Figure 2:
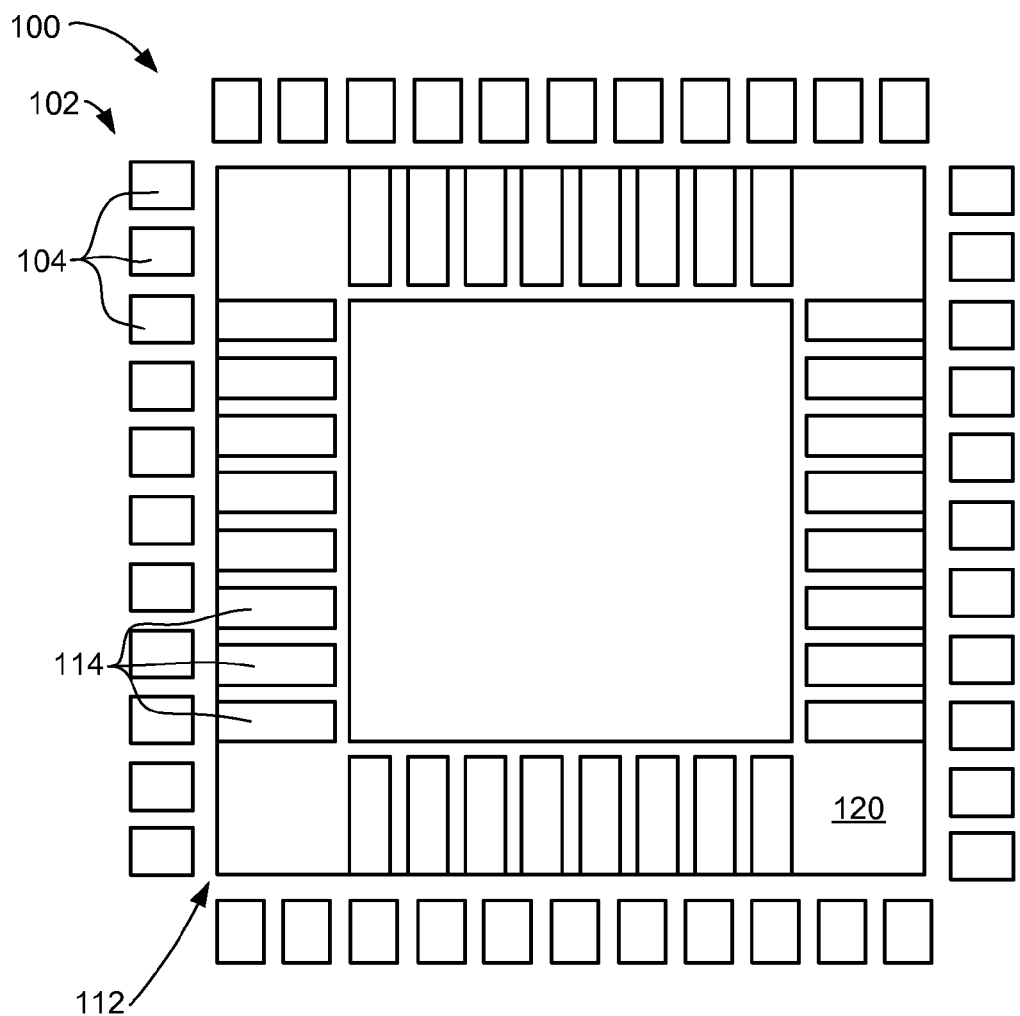
FIG. 2 is a bottom plan view of the integrated circuit leaded stacked package system.

Referring now to FIG. 2, therein is shown a bottom plan view of the integrated circuit leaded stacked package system 100. The extended-lead integrated circuit package 102 includes the extended leads 104 and the no-lead integrated circuit package 112 includes the no-lead pads 114, such as terminal lands. The extended leads 104 are held by the extended-lead encapsulant 110 of FIG. 1. The no-lead pads 114 are held substantially fixed by the no-lead encapsulant 120. The lower surface of the extended leads 104 and the lower surface of the no-lead pads 114 provide a connection surface on a bottom surface of the integrated circuit leaded stacked package system 100. The extended leads 104 of the extended-lead integrated circuit package 102 and the no-lead pads 114 of the no-lead integrated circuit package 112 provide electrical interconnectivity to the next level system.

For illustrative purposes, the extended-lead integrated circuit package 102 is shown with 44 of the extended leads 104 and the no-lead integrated circuit package 112 is shown with 32 of the no-lead pads 114, although it is understood that any number of leads may be used.

Figure 3:
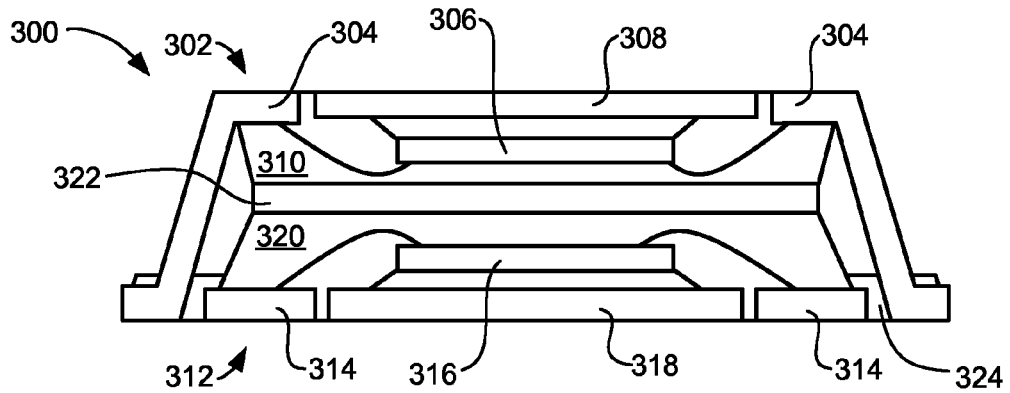
FIG. 3 is a cross-sectional view of a medium integrated circuit leaded stacked package system in an alternative embodiment of the present invention.

Referring now to FIG. 3, therein is shown a cross-sectional view of a medium integrated circuit leaded stacked package system 300 in an alternative embodiment of the present invention. The medium integrated circuit leaded stacked package system 300 may be approximately 10 mm×10 mm to approximately 18 mm×18 mm. Similar to the integrated circuit leaded stacked package system 100 of FIG. 1, the medium integrated circuit leaded stacked package system 300 includes an extended-lead integrated circuit package 302.

The extended-lead integrated circuit package 302 includes extended leads 304. A first integrated circuit die 306 is attached and electrically connected to the extended leads 304 and an extended-lead die paddle 308. The first integrated circuit die 306 is substantially fixed on the extended-lead die paddle 308. An extended-lead encapsulant 310, such as a mold cap or cover, may be applied with a substantially one-sided molding process to cover the first integrated circuit die 306 and partially covers the extended leads 304.

For illustrative purposes, the first integrated circuit die 306 is shown as a wire bondable integrated circuit die, although it is understood that the first integrated circuit die 306 may be different, such as a flip chip. Further, for illustrative purposes the extended-lead integrated circuit package 302 is shown with one integrated circuit die, although it is understood that any number of integrated circuit die may be included.

The medium integrated circuit leaded stacked package system 300 also includes a no-lead integrated circuit package 312, such as a quad flat no lead, a small outline no lead or a land grid array, having no-lead pads 314. A second integrated circuit die 316 is attached and electrically connected to the no-lead pads 314 and a no-lead die paddle 318. The second integrated circuit die 316 is substantially fixed on the no-lead die paddle 318. A no-lead encapsulant 320 covers the second integrated circuit die 316 and partially covers the no-lead pads 314.

For illustrative purposes the second integrated circuit die 316 is shown as a wire bondable integrated circuit die, although it is understood that the second integrated circuit die 316 may be different, such as a flip chip. Further, for illustrative purposes the no-lead integrated circuit package 312 is shown with one integrated circuit die, although it is understood that any number of integrated circuit die may be included.

The extended-lead integrated circuit package 302 is mounted over the no-lead encapsulant 320 of the no-lead integrated circuit package 312. A package-stacking layer 322 holds the extended-lead integrated circuit package 302 and the no-lead integrated circuit package 312 in a substantially fixed position. It has been discovered that a side opposite the first integrated circuit die 306 of the extended-lead integrated circuit package 302 may serve as an interposer for additional devices or packages.

The extended leads 304 extend to a surface of the no-lead integrated circuit package 312 opposite the second integrated circuit die 316. The extended leads 304 provide electrical interconnectivity for the first integrated circuit die 306 in substantially the same plane as the no-lead pads 314. A lead-end encapsulant 324, such as glob top or resin, may be applied to provide good planarity when warpage is possible, such as in medium size packages. The lead-end encapsulant 324 is flush or co-planar with the lower surface of the extended-lead integrated circuit package 302 and the lower surface of the no-lead integrated circuit package 312. The first integrated circuit die 306 and the second integrated circuit die 316 may be connected to a next level system such as a printed circuit board.

Figure 4:
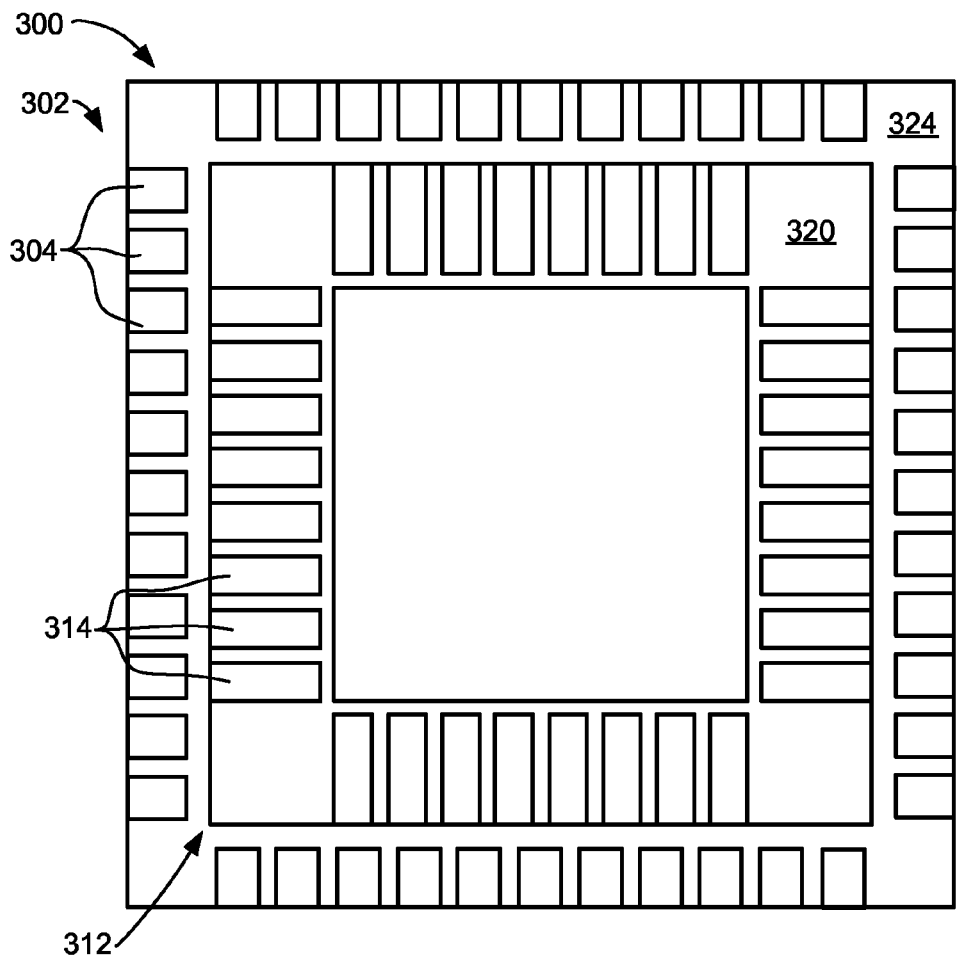
FIG. 4 is a bottom plan view of the medium integrated circuit leaded stacked package system.

Referring now to FIG. 4, therein is shown a bottom plan view of the medium integrated circuit leaded stacked package system 300. The extended-lead integrated circuit package 302 includes the extended leads 304 and the no-lead integrated circuit package 312 includes the no-lead pads 314, such as terminal lands. The extended leads 304 are held by the extended-lead encapsulant 310 of FIG. 3 and the lead-end encapsulant 324. The no-lead pads 314 are held substantially fixed by the no-lead encapsulant 320. The lower surface of the extended leads 304 and the lower surface of the no-lead pads 314 provide a connection surface on a bottom surface of the medium integrated circuit leaded stacked package system 300. The extended leads 304 of the extended-lead integrated circuit package 302 and the no-lead pads 314 of the no-lead integrated circuit package 312 provide electrical interconnectivity to the next level system.

For illustrative purposes, the extended-lead integrated circuit package 302 is shown with 44 of the extended leads 304 and the no-lead integrated circuit package 312 is shown with 32 of the no-lead pads 314, although it is understood that any number of leads may be used.

Figure 5:
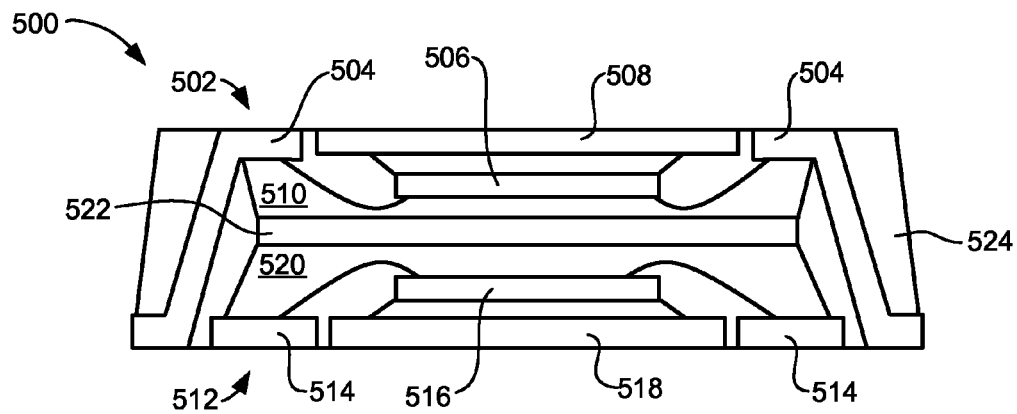
FIG. 5 is a cross-sectional view of a large integrated circuit leaded stacked package system in an alternative embodiment of the present invention.

Referring now to FIG. 5, therein is shown a cross-sectional view of a large integrated circuit leaded stacked package system 500 in an alternative embodiment of the present invention. The large integrated circuit leaded stacked package system 500 may be greater than approximately 18 mm×18 mm.

Similar to the integrated circuit leaded stacked package system 100 of FIG. 1, the large integrated circuit leaded stacked package system 500 includes an extended-lead integrated circuit package 502.

The extended-lead integrated circuit package 502 includes extended leads 504. A first integrated circuit die 506 is attached and electrically connected to the extended leads 504 and an extended-lead die paddle 508. The first integrated circuit die 506 is substantially fixed on the extended-lead die paddle 508. An extended-lead encapsulant 510, such as a mold cap or cover, may be applied with a substantially one-sided molding process to cover the first integrated circuit die 506 and partially covers the extended leads 504.

For illustrative purposes, the first integrated circuit die 506 is shown as a wire bondable integrated circuit die, although it is understood that the first integrated circuit die 506 may be different, such as a flip chip. Further, for illustrative purposes the extended-lead integrated circuit package 502 is shown with one integrated circuit die, although it is understood that any number of integrated circuit die may be included.

The large integrated circuit leaded stacked package system 500 also includes a no-lead integrated circuit package 512, such as a quad flat no lead, a small outline no lead or a land grid array, having no-lead pads 514. A second integrated circuit die 516 is attached and electrically connected to the no-lead pads 514 and a no-lead die paddle 518. The second integrated circuit die 516 is substantially fixed on the no-lead die paddle 518. A no-lead encapsulant 520 covers the second integrated circuit die 516 and partially covers the no-lead integrated circuit package 512.

For illustrative purposes the second integrated circuit die 516 is shown as a wire bondable integrated circuit die, although it is understood that the second integrated circuit die 516 may be different, such as a flip chip. Further, for illustrative purposes the no-lead integrated circuit package 512 is shown with one integrated circuit die, although it is understood that any number of integrated circuit die may be included.

The extended-lead integrated circuit package 502 is mounted over the no-lead encapsulant 520 of the no-lead integrated circuit package 512. A package-stacking layer 522 holds the extended-lead integrated circuit package 502 and the no-lead integrated circuit package 512 in a substantially fixed position. It has been discovered that a side opposite the first integrated circuit die 506 of the extended-lead integrated circuit package 502 may serve as an interposer for additional devices or packages.

The extended leads 504 extend to a surface of the no-lead integrated circuit package 512 opposite the second integrated circuit die 516. The extended leads 504 provide electrical interconnectivity for the first integrated circuit die 506 in substantially the same plane as the no-lead pads 514. A package encapsulant 524, such as a molding compound, may be applied to limit warpage for large size packages. The package encapsulant 524 is flush or co-planar with the lower surface of the extended-lead integrated circuit package 502 and the lower surface of the no-lead integrated circuit package 512. The first integrated circuit die 506 and the second integrated circuit die 516 may be connected to a next level system such as a printed circuit board.

Figure 6:
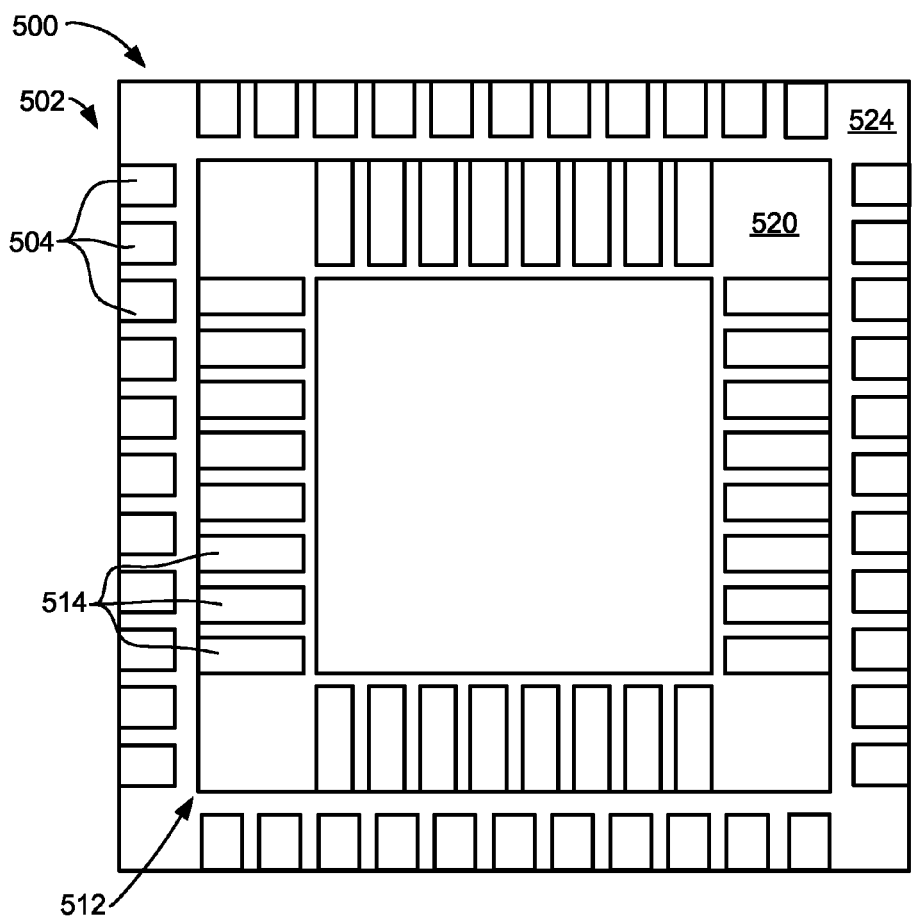
FIG. 6 is a bottom plan view of the large integrated circuit leaded stacked package system.

Referring now to FIG. 6, therein is shown a bottom plan view of the large integrated circuit leaded stacked package system 500. The extended-lead integrated circuit package 502 includes the extended leads 504 and the no-lead integrated circuit package 512 includes the no-lead pads 514, such as terminal lands. The extended leads 504 are held by the extended-lead encapsulant 510 of FIG. 5 and the package encapsulant 524. The no-lead pads 514 are held substantially fixed by the no-lead encapsulant 520. The lower surface of the extended leads 504 and the lower surface of the no-lead pads 514 provide a connection surface on a bottom surface of the large integrated circuit leaded stacked package system 500. The extended leads 504 of the extended-lead integrated circuit package 502 and the no-lead pads 514 of the no-lead integrated circuit package 512 provide electrical interconnectivity to the next level system.

For illustrative purposes, the extended-lead integrated circuit package 502 is shown with 44 of the extended leads 504 and the no-lead integrated circuit package 512 is shown with 32 of the no-lead pads 514, although it is understood that any number of leads may be used.

Figure 7:
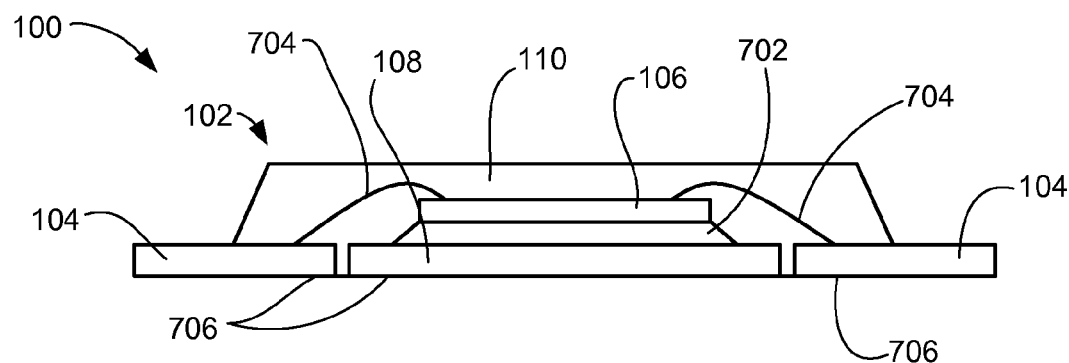
FIG. 7 is a cross-sectional view of the integrated circuit leaded stacked package system in an extended-lead-package pre-forming phase.

Referring now to FIG. 7, therein is shown a cross-sectional view of the integrated circuit leaded stacked package system 100 in an extended-lead-package pre-forming phase. The extended-lead integrated circuit package 102 includes the extended leads 104 and the extended-lead die paddle 108. The extended-lead integrated circuit package 102 may include a quad flatpack having terminals on four sides, a small outline package having terminals on two sides or a multiple row leaded package for increased I/O.

The extended leads 104 and the extended-lead die paddle 108 are formed substantially planar without the need for a downset. A first die attach material 702 attaches the first integrated circuit die 106 on the extended-lead die paddle 108. Extended-lead connections 704, such as wire bonds or solder bumps, electrically connect the first integrated circuit die 106 to the extended leads 104.

The extended-lead encapsulant 110 covers the first integrated circuit die 106, the extended-lead connections 704, the extended-lead die paddle 108 and part of the extended leads 104. An encapsulation process, such as film-assist molding, applies the extended-lead encapsulant 110 flush or coplanar with an interposer surface 706 of the extended-lead integrated circuit package 102. The interposer surface 706 of the extended leads 104 and the extended-lead die paddle 108 are substantially exposed providing a connection surface for additional devices or packages. The extended-lead encapsulant 110 may form a cover or mold cap on a side of the extended-lead integrated circuit package 102 having the first integrated circuit die 106. The extended leads 104 extend beyond the extents of the extended-lead encapsulant 110.

The extended-lead integrated circuit package 102 may be tested as a discrete package. The testing includes the first integrated circuit die 106 through the extended-lead connections 704 and the extended leads 104. Functional tests as well as performance tests may be performed on the extended-lead integrated circuit package 102. Validating the integrity and performance of components in the packaging provides a known good package with known good die. The known good package improves yield, reliability and quality of not only the integrated circuit leaded stacked package system 100 but also that of a next level system, such as a printed circuit board or another package.

Figure 8:
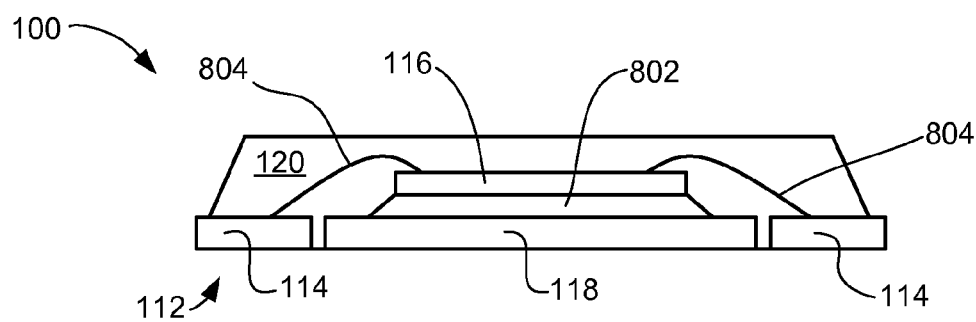
FIG. 8 is a cross-sectional view of the integrated circuit leaded stacked package system in a no-lead-package forming phase forming phase.

Referring now to FIG. 8, therein is shown a cross-sectional view of the integrated circuit leaded stacked package system 100 in a no-lead-package forming phase. The no-lead integrated circuit package 112 includes the no-lead pads 114 and the no-lead die paddle 118. A second die attach material 802 attaches the second integrated circuit die 116 on the no-lead die paddle 118. No-lead connections 804, such as wire bonds or solder bumps, electrically connect the second integrated circuit die 116 to the no-lead pads 114.

The no-lead encapsulant 120 covers the second integrated circuit die 116, the no-lead connections 804, the no-lead die paddle 118 and part of the no-lead pads 114. An encapsulation process, such as film-assist molding, applies the no-lead encapsulant 120 flush or coplanar with the bottom surface of the no-lead pads 114 and the no-lead die paddle 118. The encapsulation process provides a substantially exposed bottom surface of the no-lead pads 114 and a substantially exposed bottom surface of the no-lead die paddle 118.

The no-lead integrated circuit package 112 may be tested as a discrete package. The testing includes the second integrated circuit die 116 through the no-lead connections 804 and the no-lead pads 114. Functional tests as well as performance tests may be performed on the no-lead integrated circuit package 112. Validating the integrity and performance of components in the packaging provides a known good package with known good die. The known good package improves yield, reliability and quality of not only the integrated circuit leaded stacked package system 100 but also that of the next level system.

Figure 9:
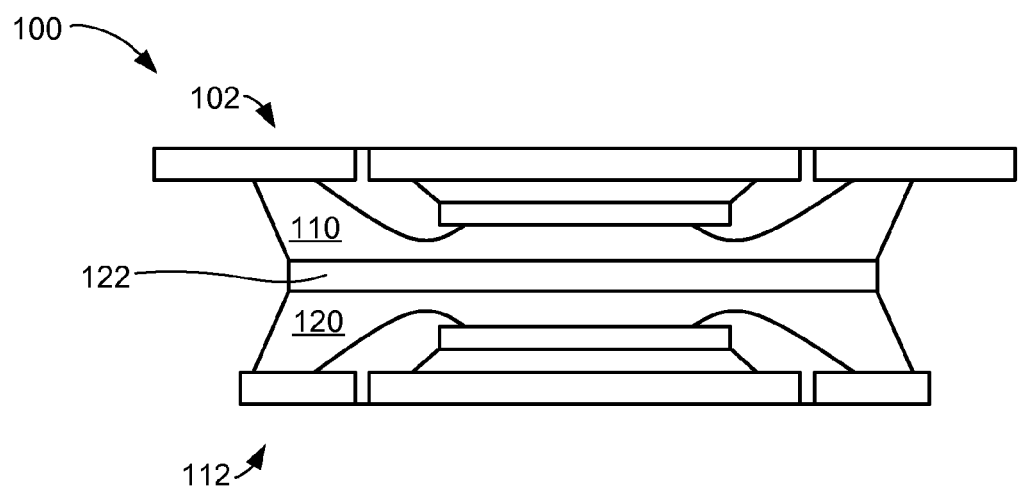
FIG. 9 is a cross-sectional view of the integrated circuit leaded stacked package system in an extended-lead-package mounting phase.

Referring now to FIG. 9, therein is shown a cross-sectional view of the integrated circuit leaded stacked package system 100 in an extended-lead-package mounting phase. The extended-lead integrated circuit package 102 includes an extended-lead mold cap formed by the extended-lead encapsulant 110. The no-lead integrated circuit package 112 includes a no-lead mold cap formed by the no-lead encapsulant 120. The package-stacking layer 122, such as an adhesive or an adhesive film, attaches the extended-lead mold cap of the extended-lead encapsulant 110 to the no-lead mold cap of the no-lead encapsulant 120. The extended-lead integrated circuit package 102 and the no-lead integrated circuit package 112 are held substantially fixed for further processing and attachment to the next level system. The package-stacking layer 122 may also provide thermal or electrical properties, such as heat dissipation or electrical insulation.

Figure 10:
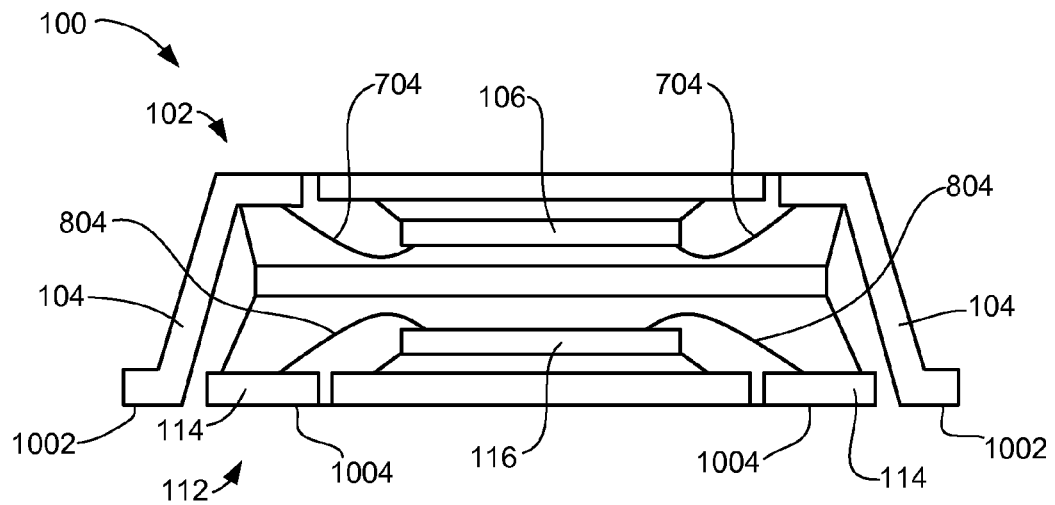
FIG. 10 is a cross-sectional view of the integrated circuit leaded stacked package system in an extended-lead package trim-and-form phase.

Referring now to FIG. 10, therein is shown a cross-sectional view of the integrated circuit leaded stacked package system 100 in an extended-lead package trim-and-form phase. The extended-lead integrated circuit package 102 includes the extended leads 104 having an extended-lead interconnectivity surface 1002. The extended leads 104 are further formed by a trim and form process by which the extended leads 104 may be cut and bent to a predetermined shape and a predetermined height.

The extended leads 104 are bent in a direction towards a side of the extended-lead integrated circuit package 102 having the first integrated circuit die 106 and along the sides of the no-lead integrated circuit package 112. The extended leads 104 provide the extended-lead interconnectivity surface 1002 substantially coplanar with a no-lead interconnectivity surface 1004 of the no-lead integrated circuit package 112. The extended leads 104 may be substantially fixed in a small size package, less than approximately 10 mm×10 mm, having substantially no package warpage.

The first integrated circuit die 106 connects through the extended-lead connections 704 and the extended leads 104. Similarly, the second integrated circuit die 116 connects through the no-lead connections 804 and the no-lead pads 114. The extended-lead interconnectivity surface 1002 of the extended leads 104 and the no-lead interconnectivity surface 1004 of the no-lead pads 114 provide a substantially planar electrical interconnectivity surface for the next level system, such as a printed circuit board.

Figure 11:
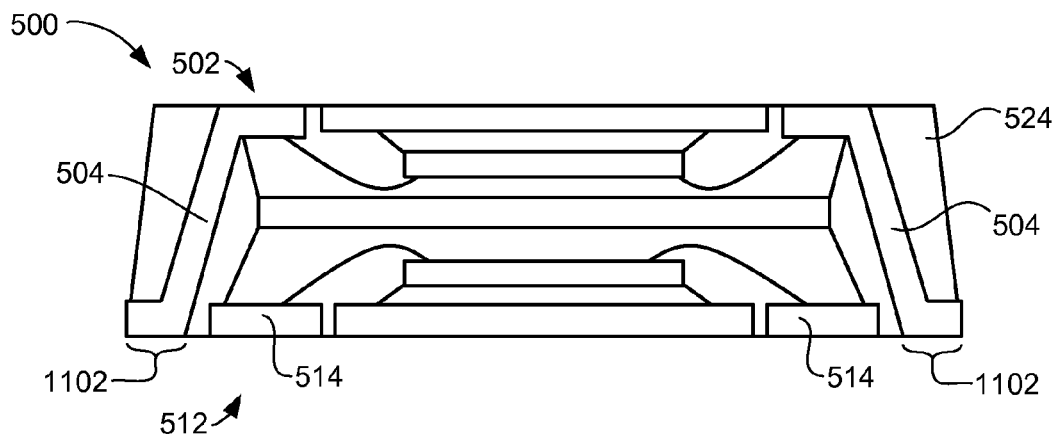
FIG. 11 is a cross-sectional view of the large integrated circuit leaded stacked package system in a package system-molding phase.

Referring now to FIG. 11, therein is shown a cross-sectional view of the large integrated circuit leaded stacked package system 500 in a package system-molding phase. The large integrated circuit leaded stacked package system 500 may be a large size package, greater than approximately 18 mm×18 mm. Some package warpage is possible with the large size package. The package encapsulant 524, such as molding compound, may be applied to provide good planarity when warpage is possible. An encapsulating process may be used to apply the package encapsulant 524.

The package encapsulant 524 covers a portion of the no-lead integrated circuit package 512 and a portion of the extended-lead integrated circuit package 502 including lead ends 1102 of the extended leads 504. The package encapsulant 524 provides a substantially fixed position for the extended leads 504. The substantially fixed position of the extended leads 504 provides isolation between each of the extended leads 504 as well as coplanarity between the extended leads and the no-lead pads 514.

Similarly, the medium integrated circuit leaded stacked package system 300 of FIG. 3 may be a medium size package, approximately 10 mm×10 mm to 18 mm×18 mm. Some package warpage is possible with the medium size package. The lead-end encapsulant 324 of FIG. 3, such as glob top or resin, may be applied to provide good planarity when warpage is possible. An encapsulating process may be used to apply the lead-end encapsulant 324.

The lead-end encapsulant 324 covers the bottom of the no-lead integrated circuit package 312 of FIG. 3 and the bottom of the extended-lead integrated circuit package 302 of FIG. 3 including lead ends of the extended leads 304 of FIG. 3. The lead-end encapsulant 324 provides a substantially fixed position for the extended leads 304. The substantially fixed position of the extended leads 304 provides isolation between each of the extended leads 304 as well as coplanarity between the extended leads 304 and the no-lead pads 314 of FIG. 3.

Figure 12:
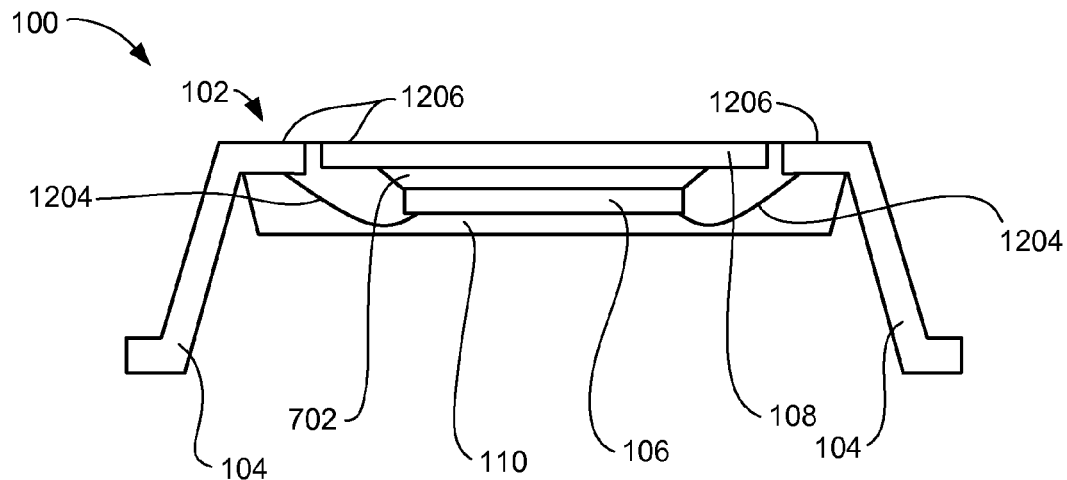
FIG. 12 is a cross-sectional view of the integrated circuit leaded stacked package system in an extended-lead-package forming phase.

Referring now to FIG. 12, therein is shown a cross-sectional view of the integrated circuit leaded stacked package system 100 in an extended-lead-package forming phase. The extended-lead integrated circuit package 102 includes the extended leads 104 and the extended-lead die paddle 108. The extended-lead integrated circuit package 102 may include a quad flatpack having terminals on four sides, a small outline package having terminals on two sides or a multiple row leaded package for increased I/O.

The extended leads 104 are formed by a trim and form process in which the extended leads 104 are bent to a predetermined shape and a predetermined height. The extended leads 104 are bent in a direction towards a side of the extended-lead integrated circuit package 102 having the first integrated circuit die 106. The first die attach material 702 may attach the first integrated circuit die 106 to the extended-lead die paddle 108. Extended-lead connections 1204 electrically connect the first integrated circuit die 106 to the extended leads 104.

The extended-lead encapsulant 110 may be used to protect the first integrated circuit die 106, the extended-lead connections 1204 and a portion of the extended leads 104. An encapsulation process, such as film-assist molding, forms the extended-lead encapsulant 110 flush or coplanar with an interposer surface 1206 of the extended-lead integrated circuit package 102. The interposer surface 1206 of the extended leads 104 and the extended-lead die paddle 108 are substantially exposed providing a connection surface for additional devices or packages.

The extended-lead encapsulant 110 is formed with a thickness lower than a height of the extended leads 104 providing an extension of the extended leads 104 beyond an extent of the extended-lead encapsulant 110. The extended-lead encapsulant 110 may form a cover or mold cap on a side of the extended-lead integrated circuit package 102 having the first integrated circuit die 106. The extension of the extended leads 104 provides space or clearance for the no-lead integrated circuit package 112 of FIG. 1.

The extended-lead integrated circuit package 102 may be tested as a discrete package. The testing includes the first integrated circuit die 106 through the extended-lead connections 1204 and the extended leads 104. Functional tests as well as performance tests may be performed on the extended-lead integrated circuit package 102. Validating the integrity and performance of components in the packaging provides a known good package with known good die. The known good package improves yield, reliability and quality of not only the integrated circuit leaded stacked package system 100 but of a next level system, such as a printed circuit board or another package.

Figure 13:
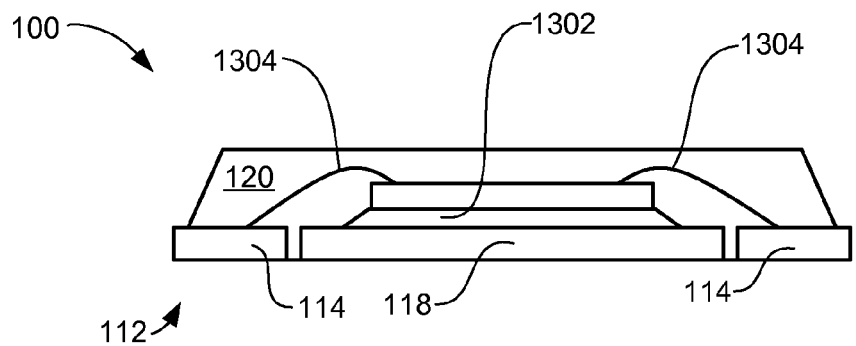
FIG. 13 is a cross-sectional view of the integrated circuit leaded stacked package system in a no-lead-package forming phase.

Referring now to FIG. 13, therein is shown a cross-sectional view of the integrated circuit leaded stacked package system 100 in a no-lead-package forming phase. The no-lead integrated circuit package 112 includes the no-lead pads 114 and the no-lead die paddle 118. A second die attach material 1302 attaches the second integrated circuit die 116 on the no-lead die paddle 118. No-lead connections 1304, such as wire bonds or solder bumps, electrically connect the second integrated circuit die 116 to the no-lead pads 114.

The no-lead encapsulant 120 covers the second integrated circuit die 116, the no-lead connections 1304, the no-lead die paddle 118 and part of the no-lead pads 114. An encapsulation process, such as film-assist molding, applies the no-lead encapsulant 120 flush or coplanar with the bottom surface of the no-lead pads 114 and the no-lead die paddle 118. The encapsulation process provides a substantially exposed bottom surface of the no-lead pads 114 and a substantially exposed bottom surface of the no-lead die paddle 118.

The no-lead integrated circuit package 112 may be tested as a discrete package. The testing includes the second integrated circuit die 116 through the no-lead connections 1304 and the no-lead pads 114. Functional tests as well as performance tests may be performed on the no-lead integrated circuit package 112. Validating the integrity and performance of components in the packaging provides a known good package with known good die. The known good package improves yield, reliability and quality of not only the integrated circuit leaded stacked package system 100 but also that of the next level system.

Figure 14:
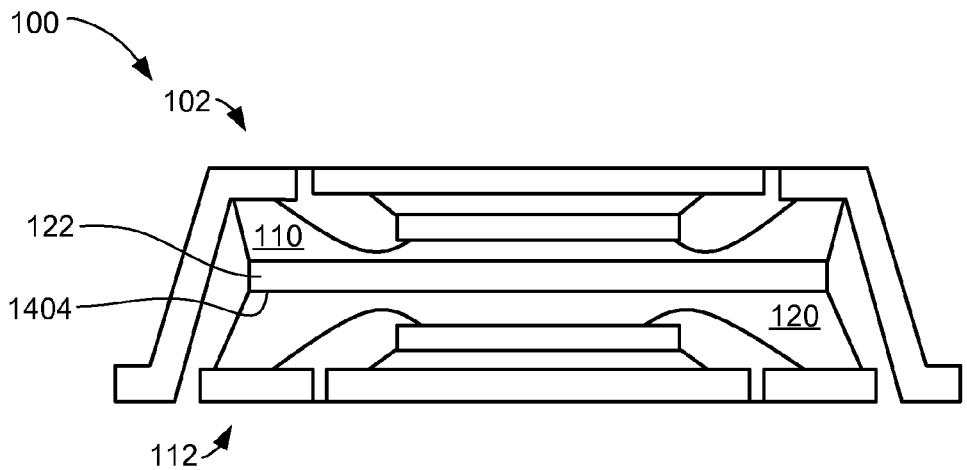
FIG. 14 is a cross-sectional view of the integrated circuit leaded stacked package system in an extended-lead-package mounting phase.

Referring now to FIG. 14, therein is shown a cross-sectional view of the integrated circuit leaded stacked package system 100 in an extended-lead-package mounting phase. The extended-lead integrated circuit package 102 includes an extended-lead mold cap formed by the extended-lead encapsulant 110. The no-lead integrated circuit package 112 includes a no-lead mold cap formed by the no-lead encapsulant 120. The package-stacking layer 122, such as an adhesive or an adhesive film, attaches the extended-lead mold cap of the extended-lead encapsulant 110 to the no-lead mold cap of the no-lead encapsulant 120. The extended-lead integrated circuit package 102 and the no-lead integrated circuit package 112 are held substantially fixed for further processing and attachment to the next level system. The package-stacking layer 122 may also provide thermal or electrical properties, such as heat dissipation or electrical insulation.

Figure 15:
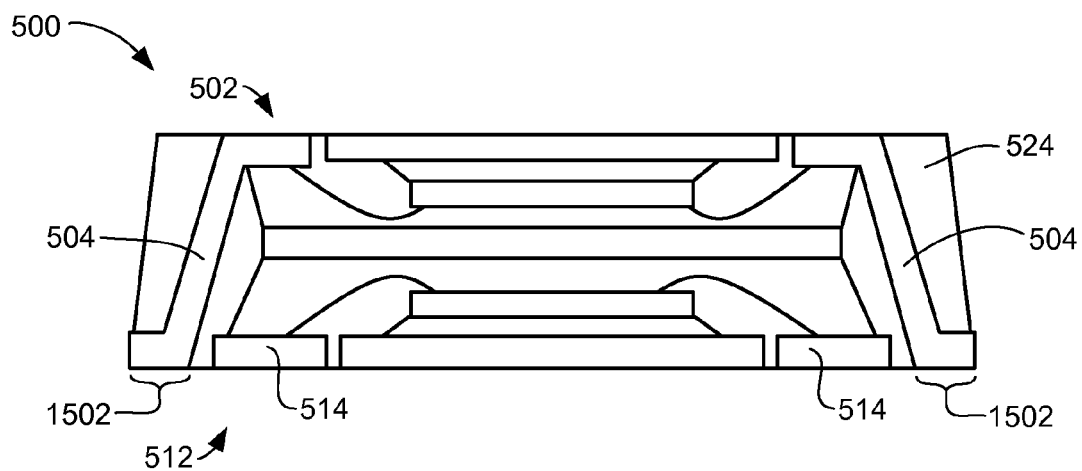
FIG. 15 is a cross-sectional view of the large integrated circuit leaded stacked package system in a package system-molding phase.

Referring now to FIG. 15, therein is shown a cross-sectional view of the large integrated circuit leaded stacked package system 500 in a package system-molding phase. The large integrated circuit leaded stacked package system 500 may be a large size package, greater than approximately 18 mm×18 mm. Some package warpage is possible with the large size package. The package encapsulant 524, such as molding compound, may be applied to provide good planarity when warpage is possible. An encapsulating process may be used to apply the package encapsulant 524.

The package encapsulant 524 covers a portion of the no-lead integrated circuit package 512 and a portion of the extended-lead integrated circuit package 502 including lead ends 1502 of the extended leads 504. The package encapsulant 524 provides a substantially fixed position for the extended leads 504. The substantially fixed position of the extended leads 504 provides isolation between each of the extended leads 504 as well as coplanarity between the extended leads 504 and the no-lead pads 514.

Similarly, the medium integrated circuit leaded stacked package system 300 of FIG. 3 may be a medium size package, approximately 10 mm×10 mm to 18 mm×18 mm. Some package warpage is possible with the medium size package. The lead-end encapsulant 324 of FIG. 3, such as glob top or resin, may be applied to provide good planarity when warpage is possible. An encapsulating process may be used to apply the lead-end encapsulant 324.

The lead-end encapsulant 324 covers the bottom of the no-lead integrated circuit package 312 of FIG. 3 and the bottom of the extended-lead integrated circuit package 302 of FIG. 3 including lead ends of the extended leads 304 of FIG. 3. The lead-end encapsulant 324 provides a substantially fixed position for the extended leads 304. The substantially fixed position of the extended leads 304 provides isolation between each of the extended leads 304 as well as coplanarity between the extended leads and the no-lead pads 314 of FIG. 3.

Figure 16:
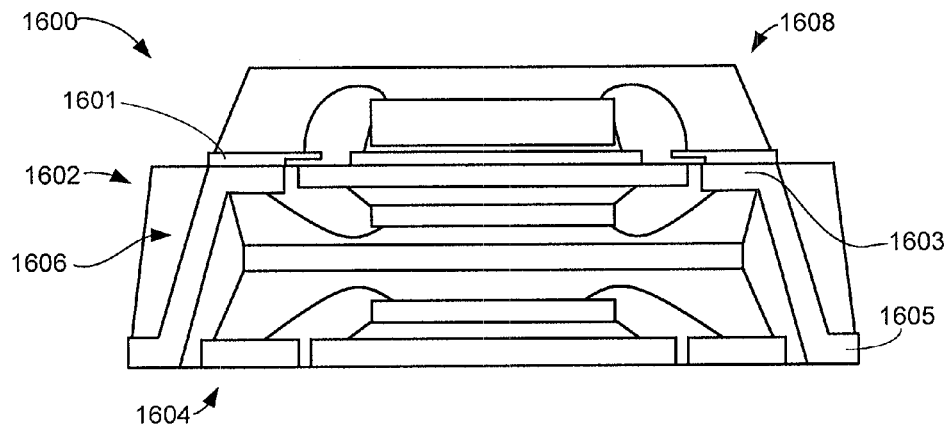
FIG. 16 is a cross-sectional view of an integrated circuit leaded stacked package system in an alternative embodiment of the present invention.

Referring now to FIG. 16, therein is shown a cross-sectional view of an integrated circuit leaded stacked package system 1600 in an alternative embodiment of the present invention. The integrated circuit leaded stacked package system 1600 includes an extended-lead integrated circuit package 1602 attached to a no-lead integrated circuit package 1604. The extended-lead integrated circuit package 1602 includes extended leads 1606. The extended leads 1606 provide electrical connectivity between the extended-lead integrated circuit package 1602 and a next level system, such as a printed circuit board.

It has been discovered that the extended-lead integrated circuit package 1602 may serve as an interposer for additional packages, such as a top integrated circuit package 1608. The top integrated circuit package 1608, such as a quad flat no lead (QFN), may include a laminate substrate or leadframe. The top integrated circuit package 1608 may be a wire bond package, flip chip package, stacked package or any combination thereof. The top integrated circuit package 1608 may be attached, such as a solder reflow process with solder balls, to the extended-lead integrated circuit package 1602. Exposed leads 1601 of the top integrated circuit package 1608 are also electrically connected and attached to a stack portion 1603 of the extended leads 1606. A base portion 1605 of the extended leads 1606, opposite the stack portion 1603, is horizontally extended away from the extended-lead integrated circuit package 1602 and the exposed leads 1601.

Figure 17:
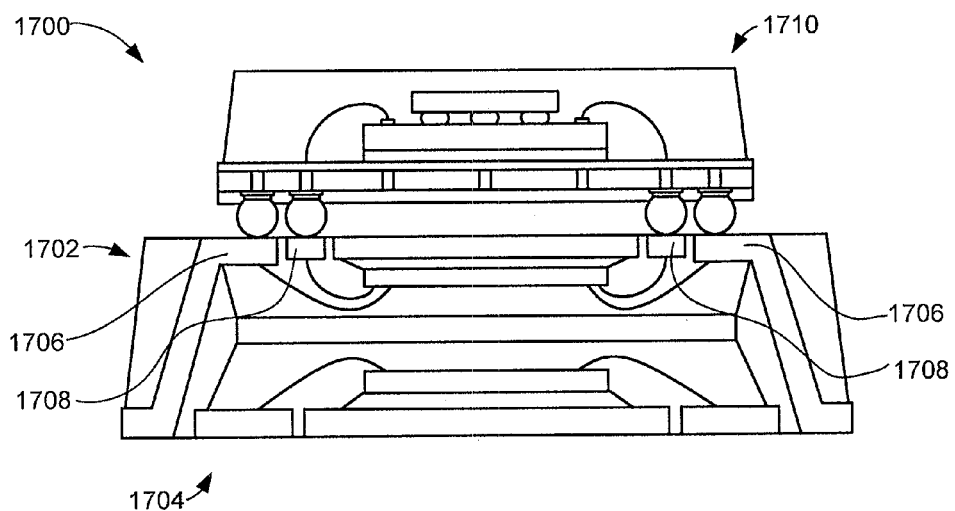
FIG. 17 is a cross-sectional view of an integrated circuit leaded stacked package system in an alternative embodiment of the present invention.

Referring now to FIG. 17, therein is shown a cross-sectional view of an integrated circuit leaded stacked package system 1700 in an alternative embodiment of the present invention. The integrated circuit leaded stacked package system 1700 includes an extended-lead integrated circuit package 1702 attached to a no-lead integrated circuit package 1704. The extended-lead integrated circuit package 1702 includes extended leads 1706 and second leads 1708. The extended leads 1706 and the second leads 1708 form multiple rows of leads providing increased signal routing. The extended leads 1706 provide electrical connectivity between the extended-lead integrated circuit package 1702 and a next level system, such as a printed circuit board. For illustrative purposes, a second row of leads is shown although it is understood that any number of rows or any configuration of leads may be used.

It has been discovered that the extended-lead integrated circuit package 1702 may serve as an interposer for additional packages, such as a top integrated circuit package 1710. The top integrated circuit package 1710, such as a ball grid array (BGA), may include a laminate substrate. The top integrated circuit package 1710 may be a wire bond package, flip chip package, stacked package or any combination thereof. The top integrated circuit package 1710 may be attached, such as a solder reflow process with solder balls, to the extended-lead integrated circuit package 1702. The extended leads 1706 and the second leads 1708 provide increased I/O and signal routing for electrical connectivity between the top integrated circuit package 1710 and the extended-lead integrated circuit package 1702.

Figure 18:
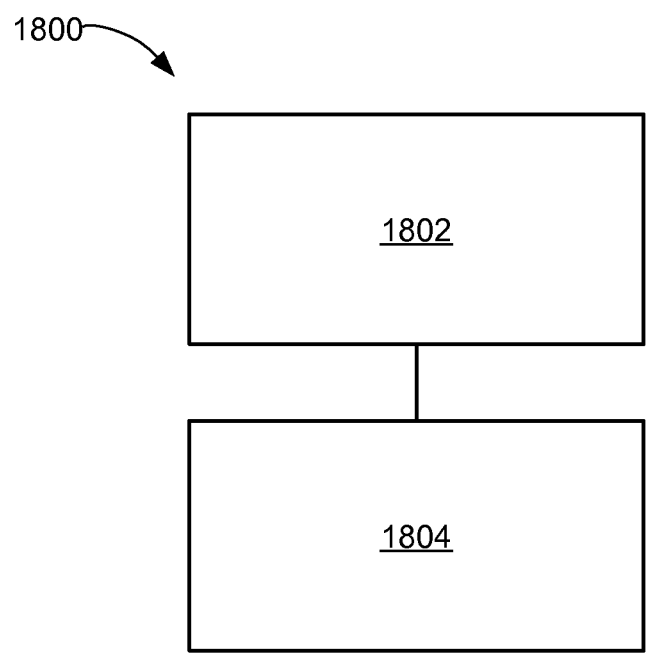
FIG. 18 is a flow chart of an integrated circuit leaded stacked package system for manufacturing the integrated circuit leaded stacked package system in an embodiment of the present invention.

Referring now to FIG. 18 is a flow chart of an integrated circuit leaded stacked package system 1800 for manufacturing the integrated circuit leaded stacked package system 100 in an embodiment of the present invention. The system 1800 includes forming a no-lead integrated circuit package having a mold cap in a block 1802; and attaching a mold cap of an extended-lead integrated circuit package facing the mold cap of the no-lead integrated circuit package in a block 1804.

It has been discovered that the present invention thus has numerous aspects.

An aspect is that the present invention serves as an interposer for additional devices and components. The side opposite the integrated circuit of the extended-lead integrated circuit package provides electrical connectivity to the integrated circuits or other devices in the package. By bending the leads towards the integrated circuit, the extended-lead integrated circuit package 102 provides a connectivity surface.

It has been discovered that the disclosed structure provides improved yield. Testing each integrated circuit package individually ensures a known good package with a known good die. Integrated circuits and their packages can be sorted before additional processing. The improvements in yield, reliability and quality extend to the present invention as well as any system in which it is included.

It has also been discovered that the disclosed structure provides a smaller size. The footprint as well as area is more compact and space efficient. Multiple integrated circuits are efficiently placed over one another. It is particularly efficient in the critical dimensions for surface area with significant improvements over previous approaches.

Yet another discovery of the disclosed structure is improved manufacturing. The process can be implemented by adapting known, high volume and cost effective technologies. It also eliminates the need for special processes or features such as downset packaging, which may increase costs.

Yet another discovery of the disclosed structure is that many different devices may be included within the integrated circuit package system. Different functions particularly related functions could be combined. In the case of a system in package, I/O's, A/D's, sensors, memory and processors/logic could be interconnected and encapsulated in a single package.

These and other valuable aspects of the present invention consequently further the state of the technology to at least the next level.

Thus, it has been discovered that the integrated circuit leaded stacked package system method and apparatus of the present invention furnish important and heretofore unknown and unavailable solutions, capabilities, and functional aspects. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. An integrated circuit leaded stacked package system comprising:
    forming a no-lead integrated circuit package having a mold cap;
    attaching a mold cap of an extended-lead integrated circuit package having extended leads with a stack portion opposite a base portion, the mold cap of the extended-lead integrated circuit package facing the mold cap of the no-lead integrated circuit package, the base portion thereunder; and
    attaching a top integrated circuit package with exposed leads on the stack portion of the extended leads having the base portion horizontally extended away from the exposed leads and the extended-lead integrated circuit package.

2. The system as claimed in claim 1 wherein attaching the top integrated circuit package includes attaching the top integrated circuit package on the extended-lead integrated circuit package having second leads.

3. The system as claimed in claim 1 wherein attaching the extended-lead integrated circuit package comprises applying a lead-end encapsulant over the lead ends of the extended leads.

4. The system as claimed in claim 1 wherein attaching the extended-lead integrated circuit package comprises applying a package encapsulant over a portion of the no-lead integrated circuit package and a portion of the extended-lead integrated circuit package including lead ends of the extended leads.

5. An integrated circuit leaded stacked package system comprising:
    a no-lead integrated circuit package having a mold cap;
    a mold cap of an extended-lead integrated circuit package having extended leads with a stack portion opposite a base portion, the mold cap of the extended-lead integrated circuit package facing the mold cap of the no-lead integrated circuit package, the base portion thereunder; and
    a top integrated circuit package with exposed leads on the stack portion of the extended leads having the base portion horizontally extended away from the exposed leads and the extended-lead integrated circuit package.

6. The system as claimed in claim 5 wherein the extended-lead integrated circuit package includes the extended-lead integrated circuit package having second leads.

7. The system as claimed in claim 5 wherein the extended-lead integrated circuit package comprises a lead-end encapsulant over the lead ends of the extended leads.

8. The system as claimed in claim 5 wherein the extended-lead integrated circuit package comprises a package encapsulant over a portion of the no-lead integrated circuit package and a portion of the extended-lead integrated circuit package including lead ends of the extended leads.

9. The system as claimed in claim 5 wherein:
the no-lead integrated circuit package is a no-lead integrated circuit package having a no-lead pad;
the extended-lead integrated circuit package is an extended-lead integrated circuit package with an extended lead having an extension beyond a mold cap; and further comprising:
an extended-lead integrated circuit package with a lead end of the extended lead substantially coplanar with the no-lead pad.

10. The system as claimed in claim 9 wherein the extended-lead integrated circuit package comprises extended leads formed towards a side having a first integrated circuit die.

11. The system as claimed in claim 9 wherein the extended-lead integrated circuit package comprises an interposer surface of the extended-lead integrated circuit package.

12. The system as claimed in claim 9 wherein the extended-lead integrated circuit package comprises an encapsulant with an interposer surface of the extended-lead integrated circuit package substantially exposed.

13. The system as claimed in claim 9 wherein the extended-lead integrated circuit package is an interposer.

* * * * *